US008621132B2

(12) United States Patent  (10) Patent No.: US 8,621,132 B2
Mazzola et al.  (45) Date of Patent: Dec. 31, 2013

(54) SYSTEM AND METHODS FOR MEMORY EXPANSION

(75) Inventors: Mario Mazzola, San Jose, CA (US); Satyanarayana Nishtala, Cupertino, CA (US); Luca Cafiero, Palo Alto, CA (US); Dmitry Barsky, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 599 days.

(21) Appl. No.: 11/971,080

(22) Filed: Jan. 8, 2008

(65) Prior Publication Data

US 2009/0177861 A1  Jul. 9, 2009

(51) Int. Cl.
*G06F 12/00* (2006.01)
(52) U.S. Cl.
USPC ........... 711/2; 711/167; 711/170; 711/5; 711/E12.081
(58) Field of Classification Search
None
See application file for complete search history.

(56) References Cited

U.S. PATENT DOCUMENTS

| | | | |
|---|---|---|---|
| 6,070,227 A | 5/2000 | Rokicki | |
| 6,233,650 B1 | 5/2001 | Johnson | |
| 7,133,960 B1 | 11/2006 | Thompson et al. | |
| 7,149,841 B2* | 12/2006 | LaBerge | 711/5 |
| 7,307,863 B2 | 12/2007 | Yen et al. | |
| 2002/0002662 A1* | 1/2002 | Olarig et al. | 711/167 |
| 2003/0070055 A1 | 4/2003 | Johnson et al. | |
| 2005/0027959 A1* | 2/2005 | LaBerge et al. | 711/167 |
| 2005/0066141 A1 | 3/2005 | Choi | |
| 2005/0289317 A1 | 12/2005 | Liou et al. | |
| 2006/0117152 A1 | 6/2006 | Amidi et al. | |
| 2006/0277355 A1 | 12/2006 | Ellsberry et al. | |
| 2007/0013704 A1 | 1/2007 | MacWilliams et al. | |
| 2007/0061684 A1 | 3/2007 | Rosenbluth et al. | |
| 2007/0073942 A1 | 3/2007 | Gregorius et al. | |
| 2007/0101086 A1* | 5/2007 | Ferraiolo et al. | 711/167 |
| 2007/0294503 A1 | 12/2007 | Mitra | |
| 2008/0046631 A1* | 2/2008 | Takaku et al. | 711/2 |
| 2008/0183985 A1 | 7/2008 | Bellows et al. | |
| 2008/0184093 A1 | 7/2008 | Thayer | |
| 2008/0270675 A1 | 10/2008 | Nagaraj et al. | |
| 2009/0177849 A1 | 7/2009 | Mazzola et al. | |
| 2009/0177853 A1 | 7/2009 | Mazzola et al. | |

FOREIGN PATENT DOCUMENTS

WO  WO-2009089350 A2  7/2009
WO  WO-2009089350 A3  7/2009

OTHER PUBLICATIONS

"U.S. Appl. No. 11/971,066, Final Office Action mailed Jun. 15, 2012", 28 pgs.
"U.S. Appl. No. 11/971,066, Final Office Action mailed Dec. 23, 2010", 20 pgs.
"U.S. Appl. No. 11/971,066, Non Final Office Action mailed Jul. 8, 2010", 19 pgs.

(Continued)

*Primary Examiner* — Kevin Verbrugge
*Assistant Examiner* — Arvind Talukdar
(74) *Attorney, Agent, or Firm* — Schwegman Lundberg & Woessner, P.A.

(57) ABSTRACT

This document discusses, among other things, an example system and methods for memory expansion. An example embodiment includes receiving first initialization data from a physical dual inline memory module (DIMM) and converting the first initialization data to second initialization data of a logical DIMM mapped to the physical DIMM. The example embodiment may further include programming a memory controller based on the second initialization data.

23 Claims, 16 Drawing Sheets

(56) References Cited

OTHER PUBLICATIONS

"U.S. Appl. No. 11/971,066, Non Final Office Action Mailed Dec. 19, 2011", 24 pgs.
"U.S. Appl. No. 11/971,066, Reponse filed Nov. 12, 2012 to Final Office Action mailed Jun. 15, 2012", 15 pgs.
"U.S. Appl. No. 11/971,066, Response filed Mar. 23, 2011 to Final Office Action mailed Dec. 23, 2010", 15 pgs.
"U.S. Appl. No. 11/971,066, Response filed Apr. 19, 2012 to Non Final Office Action mailed Dec. 19, 2011", 17 pgs.
"U.S. Appl. No. 11/971,066, Response filed Dec. 8, 2010 to Non Final Office Action mailed Jul. 8, 2010", 13 pgs.
"U.S. Appl. No. 11/971,091 , Response filed Apr. 19, 2012 to Non Final Office Action mailed Dec. 20, 2011", 16 pgs.
"U.S. Appl. No. 11/971,091 Non-Final Office Action mailed Aug. 23, 2010", 18 pgs.
"U.S. Appl. No. 11/971,091, Examiner Interview Summary mailed Jul. 12, 2011", 13 pgs.
"U.S. Appl. No. 11/971,091, Final Office Action mailed Mar. 23, 2011", 22 pgs.
"U.S. Appl. No. 11/971,091, Final Office Action mailed Jun. 12, 2012", 25 pgs.
"U.S. Appl. No. 11/971,091, Non Final Office Action mailed Dec. 20, 2011", 23 pgs.
"U.S. Appl. No. 11/971,091, Notice of Allowance mailed Nov. 27, 2012", 9 pgs.
"U.S. Appl. No. 11/971,091, Response filed Dec. 22, 2010 to Non Final Office Action mailed Aug. 23, 2010", 14 pgs.
"U.S. Appl. No. 11/971,091, Response filed Jul. 22, 2011 to Final Office Action mailed Mar. 23, 2011", 14 pgs.
"U.S. Appl. No. 11/971,091. Response filed Nov. 12, 2012 to Final Office Action mailed Jun. 12, 2012", 18 pgs.
"Chinese Application Serial No. 200980101786.3, Office Action mailed Nov. 27, 2012", with English translation of claims, 25 pgs.
"Chinese Application Serial No. 20098010786.3, Office Action mailed Mar. 1, 2012", with English translation of claims, 11 pgs.
"European Application Serial No. 09701136.5, Communication Pursuant to Rules 70(2) and 70a(2) mailed Dec. 27, 2011", 1 pg.
"European Application Serial No. 09701136.5, Extended Search Report mailed Dec. 7, 2011", 5 pgs.
"European Application Serial No. 09701136.5, Response filed Jun. 26, 2012 to Extended Search Report mailed Dec. 7, 2011", 11 pgs.
"International Application Serial No. PCT/US2009/030441 Written Opinion mailed Jun. 26, 2009", 4 pgs.
"International Application Serial No. PCT/US2009/030441, International Preliminary Report on Patentability mailed Jul. 22, 2010", 6 pgs.
"International Application Serial No. PCT/US2009/030441, International Search Report mailed Jun. 26, 2009", 6 pgs.

\* cited by examiner

600 ⟶

| Rank & Row Address A15-A14 | Sub-Channel | Sub-Rank |
|---|---|---|
| 0 00 | 0 | 0 |
| 0 01 | 0 | 1 |
| 0 10 | 0 | 2 |
| 0 11 | 0 | 3 |
| 1 00 | 0 | 4 |
| 1 01 | 0 | 5 |
| 1 10 | 0 | 6 |
| 1 11 | 0 | 7 |
| 2 00 | 1 | 0 |
| 2 01 | 1 | 1 |
| 2 10 | 1 | 2 |
| 2 11 | 1 | 3 |
| 3 00 | 1 | 4 |
| 3 01 | 1 | 5 |
| 3 10 | 1 | 6 |
| 3 11 | 1 | 7 |
| 4 00 | 2 | 0 |
| 4 01 | 2 | 1 |
| 4 10 | 2 | 2 |
| 4 11 | 2 | 3 |
| 5 00 | 2 | 4 |
| 5 01 | 2 | 5 |
| 5 10 | 2 | 6 |
| 5 11 | 2 | 7 |
| 6 00 | 3 | 0 |
| 6 01 | 3 | 1 |
| 6 10 | 3 | 2 |
| 6 11 | 3 | 3 |
| 7 00 | 3 | 4 |
| 7 01 | 3 | 5 |
| 7 10 | 3 | 6 |
| 7 11 | 3 | 7 |

SYSTEM AND METHODS FOR MEMORY EXPANSION

TECHNICAL FIELD

This patent document pertains generally to computer architecture and more particularly, but not by way of limitation, to a system and method for memory expansion.

BACKGROUND

Typical main memory systems consist of one or more memory channels and one or more memory modules connected to each channel.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 6 is a chart showing a memory expansion map, in accordance with an example embodiment;

DETAILED DESCRIPTION

Overview

Figure 1:
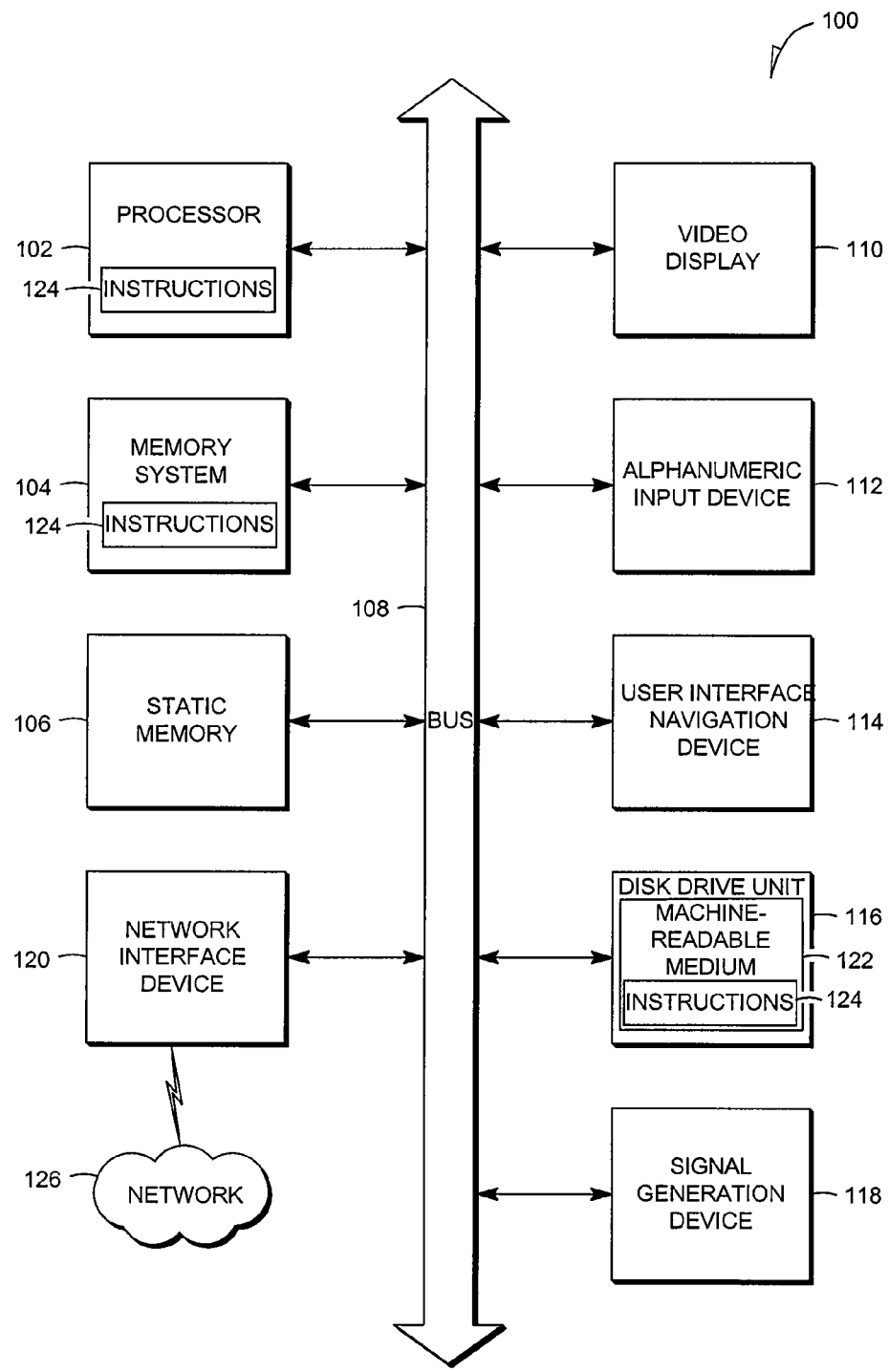
FIG. 1 is a block diagram illustrating a computer system, in accordance with example embodiments.

In general, an example system and methods are described for memory expansion.

In an example embodiment, a logical memory location corresponds to a logical rank on an RDIMM. The RDIMM may include four logical ranks of dynamic random access memory (DRAM) devices that each have 4 Gigabit (Gb) capacity and are four bits wide. An example mapping module of the present disclosure may receive an activate command from a memory controller to activate a row of memory within one of the logical ranks.

In an example configuration, physical ranks rather than logical ranks are actually coupled to the memory controller. Thirty-two physical ranks of memory devices (e.g., on eight RDIMMs), each having DRAM devices with 1 Gb capacity and being four bits wide, may be physically coupled to the memory controller via the mapping module. In response to the activate command, the example mapping module may map a logical rank number and a portion of the associated row address to one of the thirty-two physical ranks (and e.g., a sub-channel) to which a memory access request corresponds.

The memory controller may be configured by a basic input output system (BIOS) module to operate with the mapping module during initialization of the memory system. Configuration of the memory controller may include converting serial presence detect (SPD) information from the physical RDIMM to SPD information from a logical RDIMM.

Once configured, the memory controller may attempt to read from or write to a memory cell in an activated row of memory within a logical rank. Some example embodiments further include storing, in response to an activate command, the physical rank information associated with the command for each bank in a logical rank. A logical rank identification (ID) and a bank ID appearing in the initial activate command and the subsequent read, write or other command, etc., may be used to locate the physical rank corresponding to the activated row.

The mapping module may include a map and control unit and a data path unit. An example map and control unit may be configured to map logical memory addresses to physical memory addresses and to manage memory commands. Example data path units may control the flow and timing of data flow between the memory controller and physical memory devices. To connect a memory controller to a mapped physical rank, the example data path unit may connect a single communication channel to any one of multiple sub-channels using field effect transistors (FETs) as a switch.

In example embodiments, some memory commands issued to a logical rank by the memory controller are to be distributed by the mapping module to the physical ranks mapped to the logical rank. Mode register write command may also be modified to account for latency differences between logical and physical memory devices.

A memory controller may detect an error on a logical RDIMM using an error correction code (ECC). Some embodiments may include a BIOS module that may determine a physical memory address corresponding to a logical memory address reported by the memory controller as being the source of a memory error.

This overview is intended to provide an overview of the subject matter of the present patent application. It is not intended to provide an exclusive or exhaustive explanation of what is claimed. The detailed description is included to provide further information about the subject matter of the present patent application.

Example Embodiments

The following detailed description includes references to the accompanying drawings, which form a part of the detailed description. The drawings show illustrations in accordance with example embodiments. These embodiments, which are also referred to herein as "examples," are described in enough detail to provide for those skilled in the art to practice the disclosure. The embodiments may be combined, other embodiments may be utilized, or structural, logical and electrical changes may be made without departing from the scope of what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

FIG. 1 is a block diagram illustrating a computer system 100 in accordance with example embodiments. Within the computer system 100 is a set of instructions for causing the machine to perform any one or more of the methodologies discussed herein. In alternative example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 100 includes a processor 102 (e.g., a central processing unit (CPU), a graphics processing unit (GPU) or both), a memory system 104 and a static memory 106, which communicate with each other via a bus 108. The main memory system 104 may include a memory controller, a memory expansion system and a volatile memory, each (not shown) discussed in more detail below. The static or non-volatile memory 106 may store BIOS to act as an interface between system hardware and system software. The BIOS may initialize system hardware upon boot-up of the computer system.

The computer system 100 may further include a video display unit 110 (e.g., a liquid crystal display (LCD) or a cathode ray tube (CRT)). The computer system 100 also includes an alphanumeric input device 112 (e.g., a keyboard), a user interface (UI) navigation device 114 (e.g., a mouse), a disk drive unit 116, a signal generation device 118 (e.g., a speaker) and a network interface device 120.

The disk drive unit 116 includes a machine-readable medium 122 on which is stored one or more sets of instructions 124 and data structures (e.g., software) embodying or utilized by any one or more of the methodologies or functions described herein. The instructions 124 may also reside, completely or at least partially, within the main memory system 104 and/or within the processor 102 during execution thereof by the computer system 100, the main memory system 104 and the processor 102 also constituting machine-readable media.

The instructions 124 may further be transmitted or received over a network 126 via the network interface device 120 utilizing any one of a number of well-known transfer protocols (e.g., file transfer protocol (FTP)).

While the machine-readable medium 122 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure, or that is capable of storing, encoding or carrying data structures utilized by or associated with such a set of instructions. The term "machine-readable medium" shall accordingly be taken to include, but not be limited to, solid-state memories, optical and magnetic media.

Figure 2:
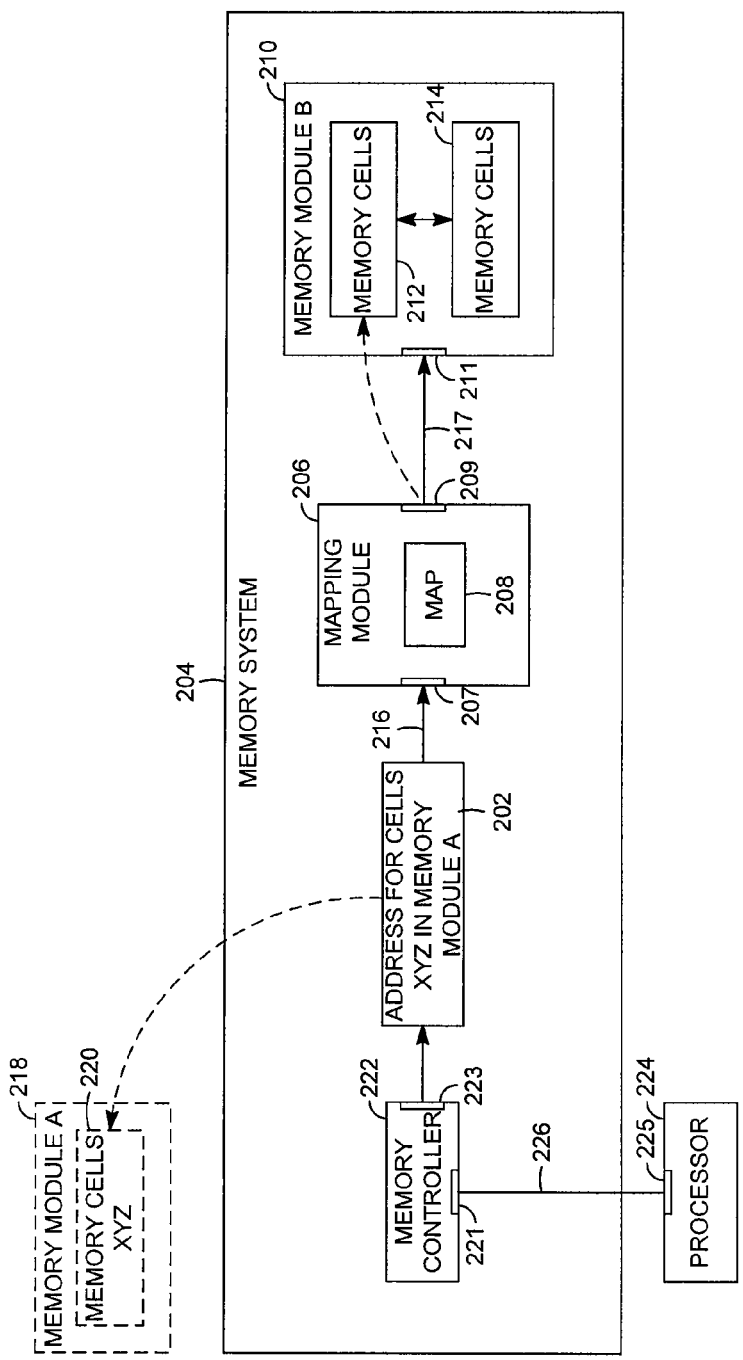
FIG. 2 is a block diagram of a memory system coupled to a processor, in accordance with an example embodiment.

FIG. 2 is a block diagram of a memory system 204 coupled to a processor 224, in accordance with an example embodiment. The memory system 204 is shown to include a memory controller 222 to provide a memory address 202, a mapping module 206 and memory module B 210. FIG. 2 shows an example relationship between the memory address 202 and memory cells XYZ 220 of the logical memory module A 218 and an example relationship between the memory address 202 and the memory cells 212 of the physical memory module B 210. The memory system 204 may be substantially similar to the memory system 104 in FIG. 1.

The processor 224 may access instructions that are stored within the memory cells 212 and 214 and may process the instructions in connection with the operation of the computer system 100 of FIG. 1. The memory cells 212 and 214 may store instructions or any other software code, records or any other data accessed by the processor 224, or by applications or operating systems (not shown) running on the computer system 100.

The processor 224 may be electronic circuitry, for example, electronic circuitry formed within a semi-conductor chip. However the processor 224 is not limited to being electronic circuitry and may perform the function of executing instructions in any fashion known by one having ordinary skill in the art. The processor 224 may include an interface 225 to transmit information to and receive information from the memory controller 222 over the communication channel 226. The memory controller 222 may include an interface 221 for transmitting information to and receiving information from the processor 224 via a communication channel 226.

The memory controller 222 may receive requests from the processor 224 to access the memory on memory module B 210. Communications between the processor 224 and the memory controller 222 may be made using a communication protocol (e.g., front side bus protocol, etc). In an example embodiment, the memory controller 222 may be integrated with the processor 224. An example memory controller 222 may receive a memory access request from the processor 224 by way of one communication protocol (e.g., a front side bus protocol) but may use a different communication protocol (e.g., double data rate (DDR)) to communicate the request to the memory module B 210 over the communication channel 216 (e.g., a computer bus). In an example embodiment, the memory controller 222 may translate the protocol used by the processor 224 into a protocol used to forward the request to the memory module B 210 via the communication channel 216.

The memory controller 222 may control the locations in which certain information is stored within the memory cells 212, 214 of the memory module B 210. In an example embodiment, the memory controller 222 may perform various other operations associated with maintaining the storage of information within the memory cells 212, 214 of the memory module B 210 (e.g., refreshing memory cells or any other maintenance operation, etc.). The functionality performed by the memory controller 222 may be implemented through logical operations. Such logical operations may be employed with software, hardware or a combination of software and hardware.

The memory address 202 may be sent by the memory controller 222 to the memory module B 210 to identify memory cells 212, 214 that are to be accessed. The memory controller 222 may transmit the memory address 202 over the communication channel 216 via the interface 223. In an example embodiment, the memory cells are addressed by the memory address 202 using the binary numeral system by encoding a sequence of zeros and ones into a message indicating a location. However, any coding scheme may be used to encode the location of a memory cell or memory cells within a memory system. In an example embodiment, the memory address 202 encodes an address for both the memory cells XYZ 220 of the logical memory module A 218 and the memory cells 212 of the physical memory module B 210.

In example embodiment, the memory controller 222 transmits the memory address 202 as if the address were bound for the memory cells XYZ 220 of the memory module A 218. In this embodiment, the memory controller 222 expects to access the memory cells XYZ 220 on the memory module A 218. In an example embodiment, the memory system 204 does not include the memory cells XYZ 220 of the memory module A 218 and the memory system 204 does include the memory module B 210 including the memory cells 212 and the memory cells 214. The mapping module 206 may receive the memory address 202 at its interface 207 and map the memory address 202 to the memory cells 212 of the memory module B 210.

The mapping module 206 may include a map 208. The mapping module 206 may reference the map 208 to identify the memory cells 212 from the memory address 202. In an example embodiment, the mapping module 206 may receive the memory address 202 and may use the memory address 202 or a portion of the memory address 202 as an index in the map 208 for the purpose of identifying a different address (not shown) associated with the memory address 202 or the portion of the memory address 202. The new address (not shown) may correspond to the memory address 202 and may identify the address of the memory cells 212. In an example embodiment, the map 208 is a data structure (e.g., a look-up table (LUT), an index, a linked list or any other data structure appropriate to implement the map 208).

An example mapping module 206 may include an interface 207 to receive the memory address 202 and an interface 209 to access the contents of the memory module B 210 over the communication channel 217. It is to be appreciated that the communication channel 217 may include multiple sub-channels over which data may travel. A logical structure may form the functionality provided by the mapping module 206. The logical structure may be implemented using software, hardware or a combination of software and hardware.

As previously described, the memory module B 210 may include the memory cells 212 and 214, which may each include a set of memory cells. A set of memory cells may include one or more memory cells. In an example embodiment, the memory module B 210 is a dual inline memory module (DIMM) that is configured to host multiple memory devices. The sets of memory cells 212 and 214 may reside within multiple memory devices where the individual memory cells may be located. In an example embodiment, each memory device is a DRAM. A DRAM is a semiconductor memory device that stores information in memory cells constructed with capacitors. In an example embodiment, each set of memory cells 212, 214 is a "rank" of memory devices (discussed in further detail below). Further, each rank of memory devices may include one or more "banks" of memory cells (discussed in further detail below) and each bank of memory cells may include an array of rows and columns, the intersection of which are the location and the address of a memory cell.

The memory module B 210 may include an interface 211 to accommodate access requests for the memory cells 212 and the memory cells 214 or any individual memory cell within the memory cells 212 and 214. In an example embodiment, various types of memory accesses may include activating a row of cells, reading or writing a memory cell, pre-charging a row of memory cells, refreshing a memory cell or any other memory access operation known in the art.

Various constraints (e.g., standard body specifications, physical properties, etc.) may limit the number of physical ranks directly attached to the memory controller. The memory expansion system and method described herein may be used within the bounds of such constraints.

Figure 3:
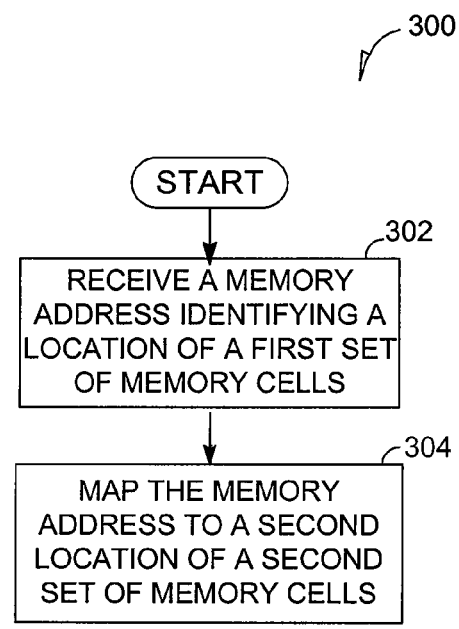
FIG. 3 is a flow diagram illustrating a method for memory expansion, in accordance with an example embodiment.

FIG. 3 is a flow diagram illustrating a method 300 for memory expansion, in accordance with an example embodiment. At block 302 the method 300 includes receiving a memory address over a communication channel. The memory address may identify a location of a first set of memory cells. Referring to FIG. 2, in an example embodiment, the mapping module 206 includes an interface 207 to receive the memory address 202 over the communication channel 216 (e.g. a first communication channel). The memory address 202 may identify a location of the memory cells XYZ 220 of the memory module A 218 (e.g., a first set of memory cells).

At block 304, the method 300 includes mapping the memory address to a second location of a second set of memory cells. The second set of memory cells may be one of multiple sets of memory cells and may be different or other than the first set of memory cells. As described above, the mapping module 206 may be coupled to the memory module B 210. The memory module B 210 is shown to include multiple sets of memory cells 212 and 214. In an example embodiment, the memory module B 210 does not include the memory cells XYZ 220 (e.g., the first set of memory cells). The mapping module 206 may map the memory address 202 to the location of memory cells 212 within the memory module B 210.

The map 208 may associate multiple memory addresses with multiple sets of memory cells. For example, the mapping module 206 may reference the map 208 to associate one of the multiple memory addresses (e.g., the memory address 202) with one of the multiple sets of memory cells such as the sets of memory cells 212 and 214 of the memory module B 210.

In an example embodiment, location information related to the location of the second set of memory cells (e.g., memory cells 212) may be stored within the mapping module 206, the larger memory system 204 or any storage accessible by the mapping module 206. Upon receiving a subsequent request (e.g., a read request from the memory controller 222) to access the second set of memory cells, the location information may be accessed and used to locate the second set of memory cells (e.g., the memory cells 212). Storing location information is discussed in further detail below.

Figure 4:
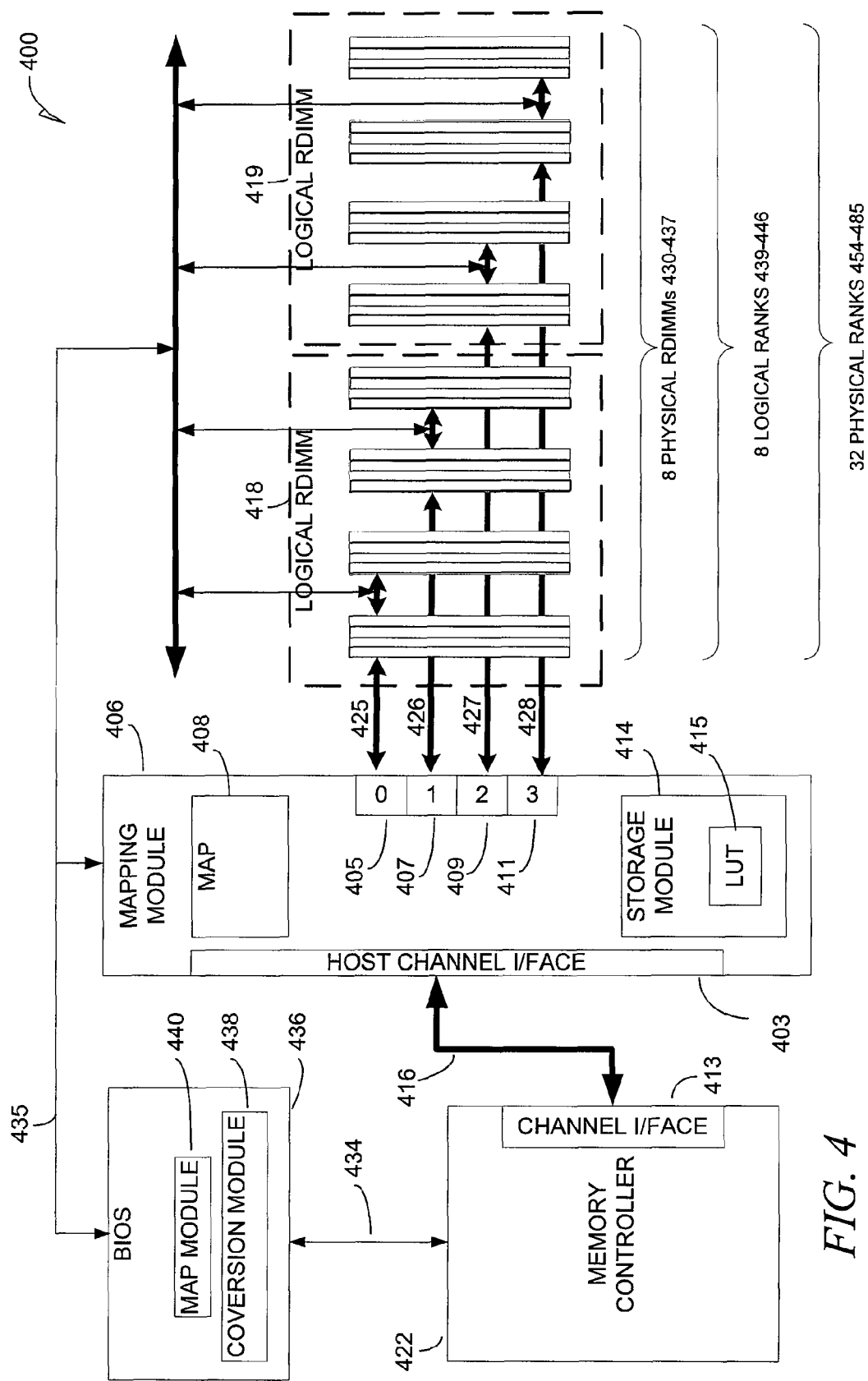
FIG. 4 is a block diagram of a memory system, in accordance with an example embodiment.

FIG. 4 is a block diagram of a memory system 400, in accordance with an example embodiment. The memory system 400 is shown to include a memory controller 422 coupled to a mapping module 406 over a communication channel 416 that is further coupled to eight physical (e.g., actual) RDIMMs 430-437 over sub-channels 425-428. It is to be appreciated that specific implementations may employ fewer or greater numbers of physical RDIMMs. An RDIMM registers address and control signals before forwarding the signals to the DRAMs residing on the RDIMMs.

A BIOS module 436 may be coupled between the memory controller 422, the mapping module 406 and the physical RDIMMs 430-437 via the communication bus 434. The BIOS module 436 is shown to include a map module 440 and a conversion module 438. In an example embodiment, the BIOS module 436 is to program the memory controller during system initialization using the conversion module 438 and based on information collected from the physical RDIMMs 430-437. The manner in which the conversion module 438 is used by the BIOS module 436 to program the memory controller is discussed in further detail below.

When the RDIMMs are in use, the BIOS module 436 may receive from the memory controller 422 via the communication buses 434, 435, the logical address of an error that has occurred on the physical RDIMMs 430-437. The memory controller 422 may find errors in memory data by detecting unexpected values in an ECC embedded within packages of retrieved memory data. The map module 440 may use logical address information (and e.g., other information associated with the error) to derive the physical address of the memory error. The BIOS module 436 may make the physical address available for inspection outside the memory system 400 (e.g., to a user-interface, not shown).

In an example embodiment, the memory controller 422 is substantially similar to the memory controller 222 shown in FIG. 2. The memory controller 422 may include a channel interface 413 that is coupled to the communication channel 416. The communication channel 416 may employ a DDR bus that transfers data on both the rising and falling edges of a clock signal for data and a single data rate (SDR) bus that transfers address and control on each rising edge of clock.

The mapping module 406 may include an interface 403 that is coupled to the communication channel 416. The interface 403 may be equipped to transmit and receive data over a DDR bus. The mapping module 406 may also include a map 408 that is substantially similar to the map 208 of FIG. 2. The mapping module 406 may also be coupled to the storage module 414.

The storage module 414 may be used to store all or a portion of a memory address that is the result of mapping a memory address. In an example embodiment, the storage module 414 may include a data structure (e.g., a LUT 415, an index, a linked list or any other data structure) appropriate to facilitate locating all or a portion of a mapped memory address.

The mapping module 406 may further include interfaces 405, 407, 409 and 411 to couple the mapping module to the eight physical RDIMMs 430-437 via the four sub-channels 425 through 428 respectively. Each physical RDIMM 430-437 may include multiple sets of memory devices (e.g. shown in FIG. 6). In an example embodiment, the memory devices are grouped within a larger set of memory devices called a physical rank. A physical rank may be a set of memory devices. Each physical RDIMM 430-437 may include multiple physical ranks. A memory address received from the memory controller 422 may identify a physical rank located within any one of the physical RDIMMs 430-437.

In an example embodiment, the communication channel 416 and the sub-channels 425-428 may include an address bus and a 72 bit wide data bus. The physical rank described above may include a set of memory devices (e.g., DRAMs) that attaches to the full width of a channel (e.g., the communication channel 416 and/or communication sub-channels 425-428) and is addressed via identification of a physical rank.

As described above, the RDIMMs 430-437 may include multiple ranks which in turn may include multiple memory devices. Each memory device may include multiple banks (e.g., see FIG. 6). A bank may be an independently addressable sub-array within a memory device (for example, a DRAM). Each bank within a DRAM can have an open (e.g., an activated) row, ready to be read, written or pre-charged. In an example embodiment, a read operation (e.g., initiated by the memory controller 422 with a read command) may fetch data from a memory device (e.g., via a column in an open row of a bank). A write operation may store data to a memory device (e.g., via a column in an open row of a bank).

In an example embodiment a DRAM includes eight internal banks. Each individual DRAM may be four or eight bits wide, meaning either four or eight bits at a time may be transferred from that particular DRAM to the communication channel (e.g., communication channel 416 or sub-channels 425-428). Since each rank attaches to the full width of the data channel, the width of a DRAM may determine the number of DRAMs within a rank. In an example embodiment, the memory controller 422, the communication channel 416 and the sub-channels 425-428 support eight ranks of DRAM devices per channel. In an example embodiment, the densest RDIMM for a given DRAM density (e.g., DRAM density may be 512 megabits, 1 Gb, 2 Gb, 4 Gb, etc.) is a quad rank (e.g., four ranks) RDIMM, built using x4 devices (e.g., four bits wide). A quad rank x4 RDIMM with eight error correction bits has 72 devices (e.g., four ranks×18 devices per rank).

Logical RDIMMS 418 and 419 may be the RDIMMs that the memory controller 422 initially addresses via the communication channel 416. The physical RDIMMs 430-437 may be the RDIMMs that the memory controller 422 actually addresses after the initial address is mapped with the mapping module 406. Logical RDIMMs 418 and 419 may include logical ranks 439-446 that are the set of all memory devices (for example, DRAMs) that can be accessed via a single rank ID from the memory controller 422. In an example embodiment, each logical rank 439-446 is a physical RDIMM (e.g., one of the physical RDIMMS 430-437) and maps to four physical ranks.

Figure 5:
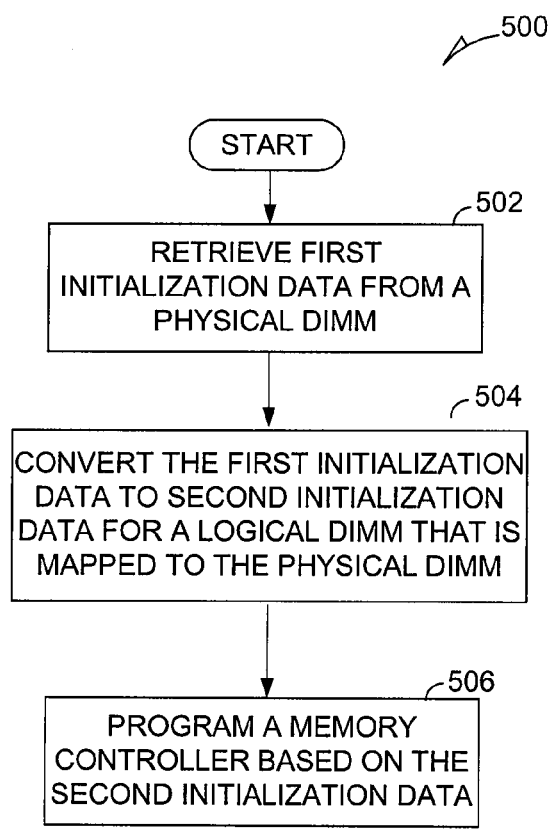
FIG. 5 is a flow diagram illustrating a method for programming a memory controller, in accordance with an example embodiment.

FIG. 5 is a flow diagram of a method 500 for programming a memory controller in accordance with an example embodiment. At block 502, the method 500 may include retrieving first initialization data from a physical DIMN. As shown in FIG. 4, the BIOS module 436 is coupled between the RDIMMs 430-437 and the memory controller 422 and may be configured to retrieve the initialization data from the physical RDIMMs.

Examples of the types of information the BIOS module 436 retrieves may include SPD information indicating the capacity of each physical RDIMM, a number of ranks per physical RDIMM, timing information, latency information, a manufacturer of the RDIMM or other information, etc. concerning the physical RDIMMs 430-437.

At block 504, the method 500 may include converting the first initialization data to second initialization data for a logical DIMM that is mapped to the physical DIMM. In an example embodiment, the BIOS module 436 may perform the conversion using a linear function (e.g., by multiplying a first initialization value by a factor to get the second initialization value).

At block 506, the method 500 may include programming a memory controller based on the second initialization data. In an example embodiment, the BIOS module 436 uses the converted initialization data to program the memory controller 422. It is to be noted that in example embodiments, the memory controller may be programmed based on initialization data for a logical rank of memory devices, when the memory controller is actually connected with physical ranks of memory devices.

FIG. 6 is a chart showing a memory expansion map 600, in accordance with an example embodiment. The memory expansion map 600 maps an address received by the mapping module 406 to sub-channels (e.g., column 604 and sub-channels 425-428) and sub-ranks (e.g., physical ranks) located within the physical RDIMMs 430-437.

Column 602 generally shows logical rank IDs and two bits (e.g., A15-A14) of multi-bit row addresses. A full multi-bit row address may identify a row of memory cells located within a memory device of a logical rank (e.g., within logical RDIMMs 418-419) as well as within a physical rank (e.g., within physical RDIMMs 430-437).

In an example embodiment, the mapping module 406 extracts the logical rank ID and the last two bits of a row address from an incoming address and references the memory expansion map 600 to identify a corresponding sub-channel and sub-rank (e.g., physical rank). In the ninth entry 608 of column 602, the "2" represents the rank ID of a logical rank and the "00" are the last two bits of a row address. When an address is mapped, these values map to a particular sub-channel and sub-rank (e.g., a physical rank). Column 604 represents a corresponding sub-channel, for example, one of the sub-channels 425-428 of FIG. 4. Column 605 represents a corresponding sub-rank (e.g., one of the sub-ranks included within a logical rank of a logical RDIMM).

As described above with respect to FIG. 4, each logical RDIMM 418-419 includes four logical ranks. Each logical rank is actually a physical RDIMM consisting of four physical ranks. Those physical ranks are the sub-ranks of the logical ranks in the RDIMMs 418 and 419.

In the example memory expansion map 600, an address indicating a logical rank ID of "0" or "1" may be directed by the mapping module 406 to sub-channel "0". An address indicating a logical rank ID of "2" or "3" may be directed to sub-channel "1" by the mapping module 406 and so forth, etc. As can be seen in the map 600, the first four entries include logical rank IDs of "0". Thus, the entries all correspond to the same logical rank (but note that one logical rank e.g., may correspond to the four sub-ranks of column 606 indicated by the values "0," "1," "2," and "3").

It is to be appreciated that a single sub-channel, as indicated by like numerals (e.g., 0's, 1's, etc.) in column 604, corresponds to eight sub-ranks. As described above with respect to an example embodiment, eight physical ranks may be supported by a DDR channel.

Figure 7:
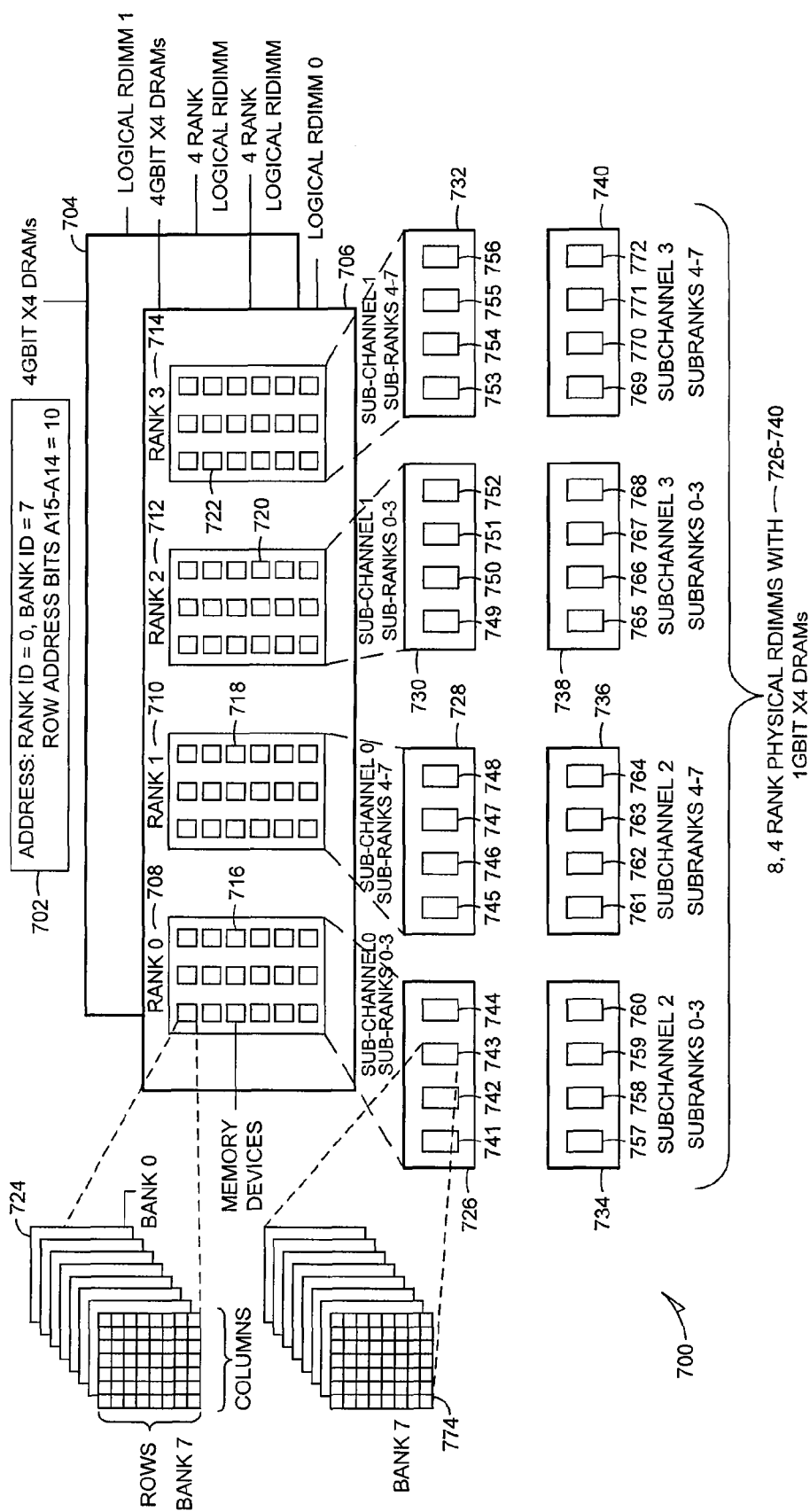
FIG. 7 is a block diagram showing an example relationship between logical Registered Dual Inline Memory Modules (RDIMMs) and the physical RDIMMs.

FIG. 7 is a block diagram showing example relationships 700 between the logical RDIMMs 706, 704 and the physical RDIMMs 726, 728, 730, 732, 734, 736, 738 and 740 respectively. The example RDIMM 706 includes logical ranks 708, 710, 712 and 714. The logical ranks 708, 710, 712 and 714 further include the memory devices 716, 718, 720 and 722 respectively. The physical RDIMMs 726, 728, 730, 732, 734, 736, 738 and 740 further include four each of the physical ranks 741-772 respectively. In an example embodiment, the logical rank 708 corresponds to the physical RDIMM 726 which includes the physical ranks 741-744 (e.g., the sub-ranks). There may be similar correspondences between other logical and physical ranks.

The example address 702 indicates a rank ID of "0" which is a logical rank, a bank ID of "7" and a row address with its last two bits (e.g., A15-A14) being "10". Referring to the map of FIG. 6, a logical rank with the rank ID of "0" in combination with A15-A14 bits of "10" maps to sub-rank two, (e.g., which is physical rank 743 of the physical RDIMM 726) over sub-channel zero. The bank and the remaining row address bits (A13-A0), however, are common to both the logical and physical memory devices.

A number of banks 724 and 774 corresponding to a memory device within the logical rank 708 and the physical rank 743, respectively, are shown with the rows and columns of a particular bank to illustrate the location of memory cells in a row which is indicated by example bank and row number. In an example embodiment, a bank ID of "7" and a row address "ABC01" may be used to identify bank "7" row ABC01 in the logical memory device (e.g., banks 724) and the physical device (e.g., banks 774). The figure also shows similar relationships between logical ranks 710, 712 and 714 and the sub-ranks 745 through 748, 749 through 752 and 753 through 756 respectively.

Referring again to FIG. 4, the memory controller 422 may produce an address and send the memory address along with an activate command over the communication channel 416 (e.g., a DDR channel) to the mapping module 406. The mapping module 406 may recognize that the memory address identifies the location of a logical rank (e.g., logical rank 439) with a logical rank ID. The mapping module 406 may also recognize that the memory address includes a bank ID and row address.

In an example embodiment, the memory address is mapped to a second location of a physical rank where the activate command is asserted. The physical rank may be one of the 32 physical ranks (e.g., a plurality of sets of memory cells) within the physical RDIMMs 430-437. In mapping the memory address, the mapping module 406 may reference the map 408 to associate the logical rank ID and one or more bits of the row address with the physical rank.

Figure 8:
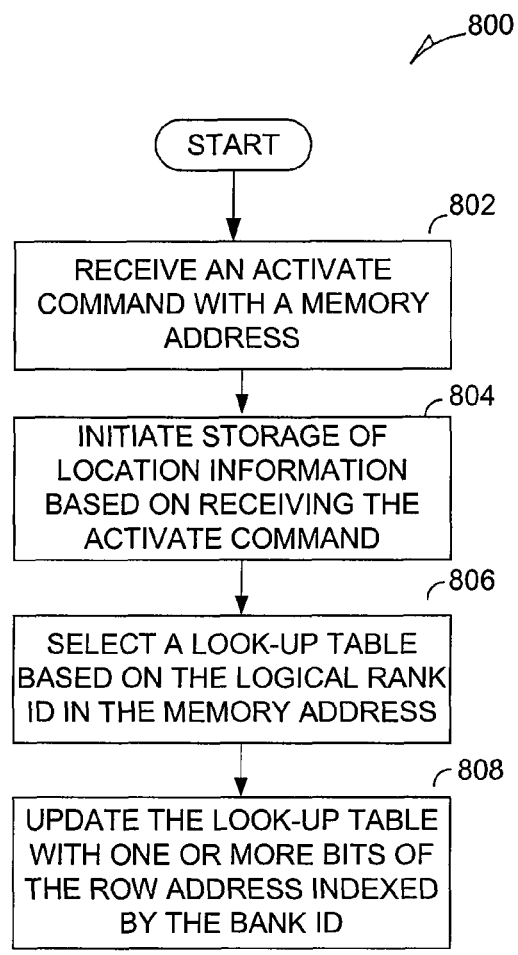
FIG. 8 is a flow diagram of a method for storing location information, in accordance with an example embodiment.

FIG. 8 is a flow diagram of a method 800 for storing location information, in accordance with an example embodiment. At block 802 the method 800 may include receiving an activate command to activate a row of memory cells. The activate command may be received incidental (e.g., along with) to the receiving of a memory address (e.g., as described above). The activate command received by the mapping module 406 may be to activate a row of memory cells (e.g., the row being indicated by the memory address) within the logical ranks of the logical RDIMMs 418 and 419 but may actually activate a row within a physical rank.

At block 804, the method 800 includes initiating a storing of location information based on the receiving of the activate command. In FIG. 4, the mapping module 406 may be coupled to and communicate with the storage module 414. In an example embodiment, in response to receiving the activate command the mapping module 406 may store location information within the storage module 414. The location information may be related to a physical rank selected from the physical ranks 454-485 whose location is encoded by the map 408 within the mapping module 406 (see FIG. 4).

At block 806, the storing of the location information includes selecting a LUT based on the logical rank ID. As described above, the storage module 414 may include a LUT for every logical rank 439-446. In an example embodiment, the mapping module 406 selects one of the LUTs based on the logical rank ID received with the memory address.

At block 808 the storing of the location information further includes updating the LUTs with the one or more bits of the row address indexed by the bank ID. Once a LUT 415 has been selected, the mapping module 406 may update the LUT 415 with one or more bits of the row address (e.g., from the memory address referred to above) indexed with the bank ID received with the memory address. If the location information is later desired (e.g., to locate an activated row of memory within a physical rank), the bank ID may be used as an index to the one or more row bits. The logical rank and ID and the one or more row bits may then be used (e.g., in a map) to identify the physical rank 454-485 for which the location information was originally stored.

In an example embodiment, the mapping module 406 may detect the receipt of a memory access request that includes logical rank ID and a bank ID. Example memory access requests may include a read command, write command, pre-charge command, or any memory access command targeting a row of memory, etc. The location information may be accessed to identify the target physical rank of the memory access request.

The mapping module 406 may identify an appropriate LUT 415 in the storage module 414 based on the logical rank ID received with the memory access request. The mapping module 406 may then use the bank ID (e.g., received with the memory access request), as an index to the one or more bits of the row address. With the logical bank ID and the bits of the row address, the mapping module 406 may determine that the physical rank (e.g., one of the physical ranks 454-485), corresponding to the logical rank ID and the one or more bits of the memory address, includes an activated row of memory. In an example embodiment, the mapping module 406 may direct the memory access request to the identified activated row. If the memory access command is a read or write command, then the activated row is to be read or written, respectively. If the memory access command is a pre-charge command, the activated row is to be pre-charged, and so on.

In some example embodiments, the memory controller 422 may assert consecutive write commands to the same logical rank (e.g., one of the logical ranks 439-446 in the logical RDIMM 418) but the commands may be mapped to different physical ranks on the same physical RDIMM (e.g., physical ranks 454-457 within the physical RDIMM 430). In an example embodiment, a physical rank being written provides termination during a write operation. Termination may be used to regulate a level of electrical noise on a communication channel. To avoid doubly terminating the communication sub-channel (e.g., a bus) when the signal at the end of one write transfer overlaps the preamble signal of a subsequent write, the memory controller 422 may introduce a bus cycle between the write operations during which no data is transferred.

Alternatively or additionally, consecutive write operations may be supported without introducing a bus cycle where no data is transferred. For example, one physical rank (e.g., physical rank 454) may provide termination for all writes to the physical RDIMM 430, while another physical rank (e.g., physical rank 455) provides termination for an electrical stub that the RDIMM (e.g., RDIMM 430) becomes when a write or read command targets another physical RDIMM (e.g., physical RDIMM 431).

It is to be appreciated that a physical memory device may return an incorrect sequence of bits in response to a memory request. In an example embodiment, RDIMMs 430-437 include one or more memory devices to store ECC bits to allow the memory controller 422 to detect and possibly correct memory errors.

Figure 9:
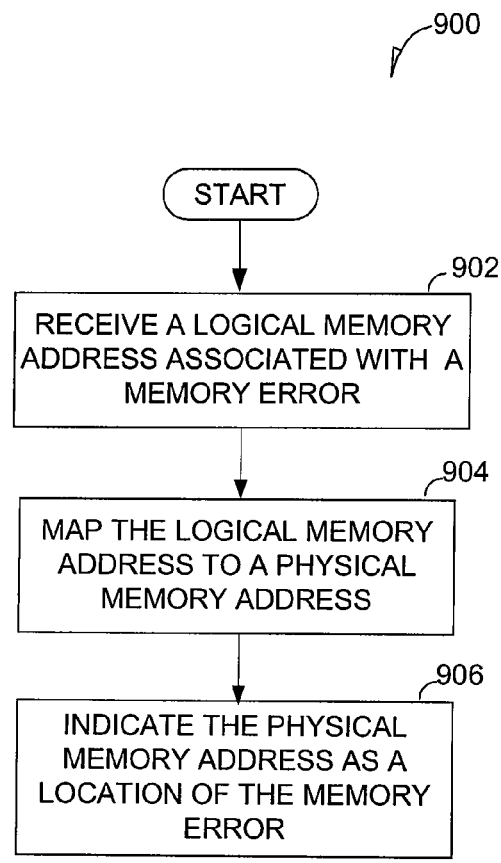
FIG. 9 is a flow diagram illustrating a method for reporting a memory error, in accordance with an example embodiment.

FIG. 9 is a flow diagram illustrating a method 900 for reporting a memory error, in accordance with an example embodiment. At block 902, the method 900 may include receiving a logical memory address associated with a memory error. The BIOS module 436 is shown to be coupled with the memory controller 422 and may receive the logical memory address associated with the memory error from the memory controller 422.

In an example embodiment, the memory controller 422 may detect the memory error using an 8 bit ECC code. The error detected by the memory controller 422 may be a one or two bit error and the memory controller 422 may correct those errors that are one bit errors. In some example embodiments, multiple bit errors may be both detected and corrected by the memory controller 422.

Block 904 of the method 900 may include mapping the logical memory address to a physical memory address. In an example embodiment, the BIOS module 436 may reference the map module 440 that maps the logical memory address of the memory error to a physical memory address on a physical memory device (e.g., the physical RDIMM 430).

At block 906, the method 900 may conclude with indicating the physical memory address as a location of the memory error. In various example embodiments, the BIOS module 436 may indicate the physical memory address as a physical location of a memory error. The BIOS module 436 may indicate the physical memory address as a physical location of a memory error by signaling a user interface (e.g., a flashing light emitting diode, a warning message on a computer display or an indication using any appropriate user interface, etc.).

Figure 10:
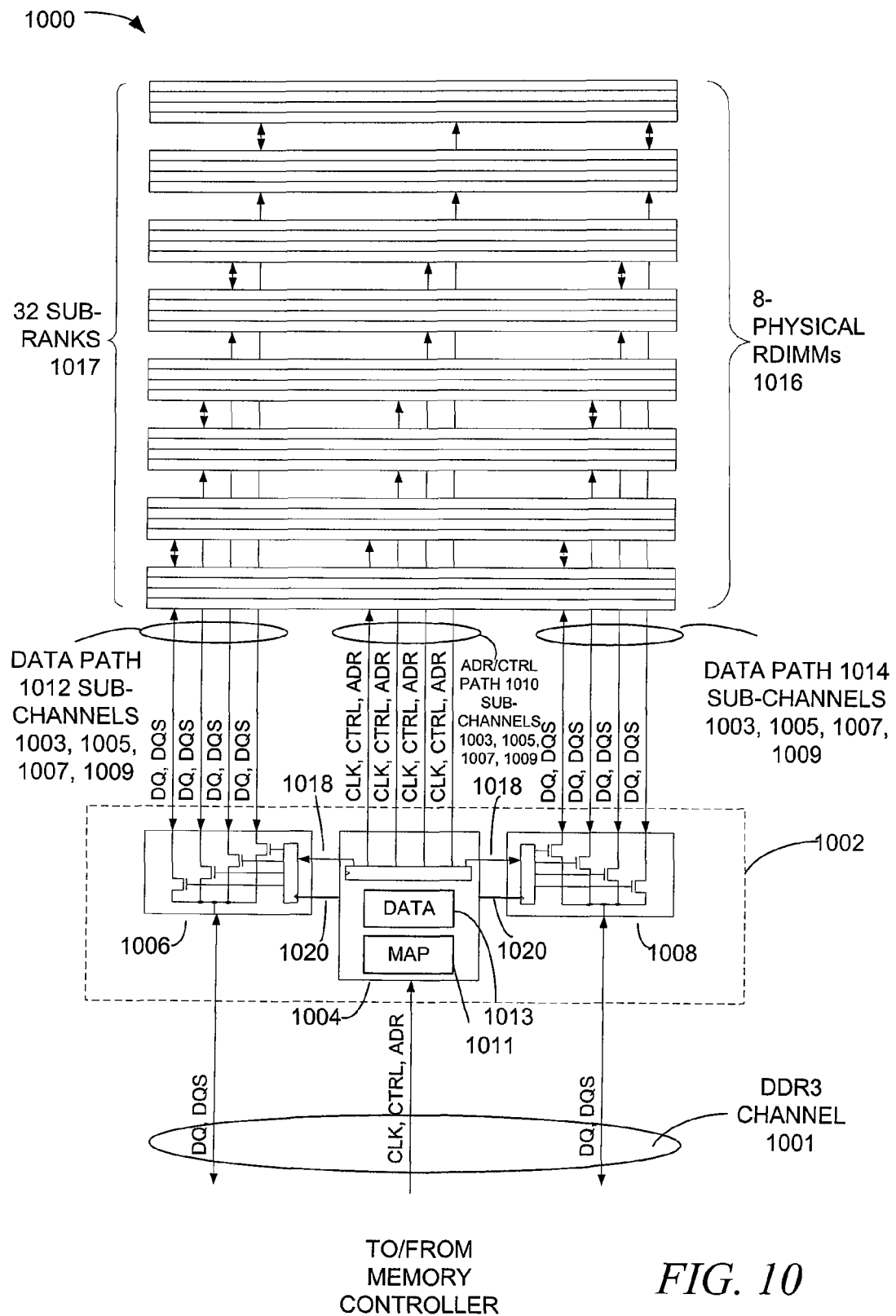
FIG. 10 is a block diagram of a memory expansion system, in accordance with an example embodiment.

FIG. 10 is a block diagram of a memory expansion system 1000, in accordance with an example embodiment. In general, the memory expansion system 1000 shows an example embodiment of a system to distribute data, address information and control information as the data flows between a single channel 1001 and multiple sub-channels and sub-ranks (e.g., physical ranks or sub-ranks 1017 of the physical RDIMMs 1016 and sub-channels 1003, 1005, 1007, 1009).

The mapping module 1002 is shown to couple with four communication sub-channels over the data paths 1010, 1012 and 1014. The data paths 1010, 1012 and 1014 are shown to couple with the physical RDIMMs 1016. The physical RDIMMs 1016 may include the 32 sub-ranks 1017. Mapping to the sub-ranks 1017 may be performed in a substantially similar fashion to what has been described above. The sub-channels 1003, 1005, 1007 and 1009 coupled to the physical RDIMMs 1016 may be 72 bits wide, and have 64 data and eight ECC bits. In an example embodiment, the physical RDIMMs 1016 are quad-ranked and use ×4 devices.

In an example embodiment, the mapping module 1002 includes electronic circuitry 1004, 1006, 1008 (e.g., a chipset) to map the DDR3 channel 1001 to the four sub-channels 1003, 1005, 1007 and 1009. The address and control path circuitry 1004 may include a map and control unit 1011 (discussed in more detail with respect to FIG. 12) to map addresses to appropriate sub-ranks and sub-channels and to manage memory commands. The address and control path circuitry 1004 may also include a data path unit 1013 (discussed in more detail with respect to FIG. 15) to configure the data connection circuitry 1006, 1008. The address and control path circuitry 1004 may communicate control signals to the data connection circuitry 1006, 1008 via paths 1018 and may communicate clock signals to the data connection circuitry 1006 via the paths 1020. Data connection circuitry 1006, 1008 connects the data and strobe lines from the host DDR3 channel 1001 onto the four sub-channels 1003, 1005, 1007 and 1009. Example data connection circuitry 1006, 1008 may use FET-switched paths between the data channel at the memory controller to the data sub-channels at the physical RDIMMs 1016. A FET switch is a device that has a low "on" resistance between a source and a drain, a high "off" resistance and a low capacitance. In an example embodiment, a FET switch may approximate the behavior of a wire when "on" and an open circuit when "off".

Figure 11:
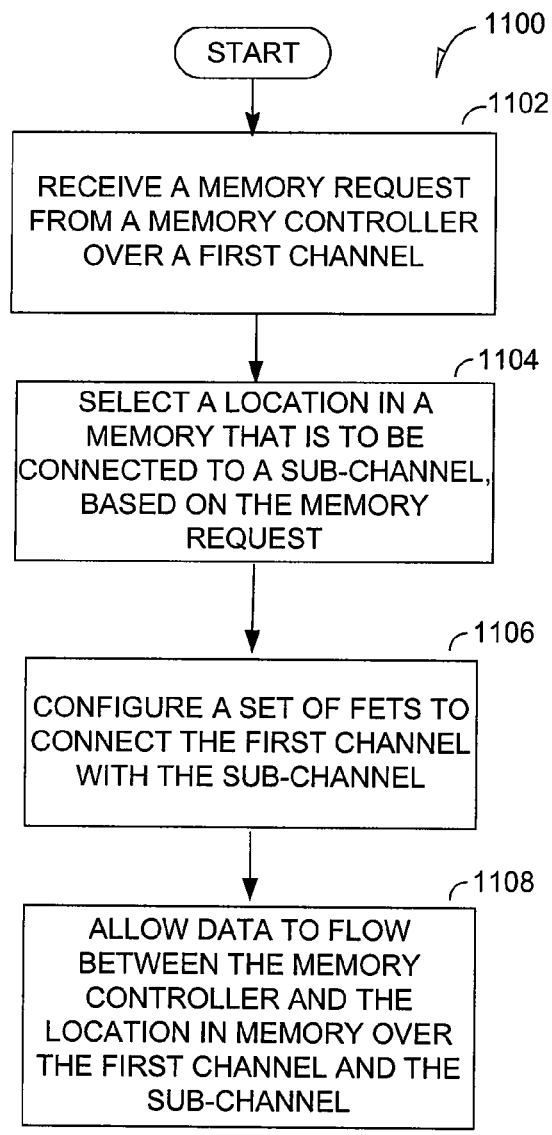
FIG. 11 is a flow diagram of a further method for memory expansion, in accordance with an example embodiment.

FIG. 11 is a flow diagram of a further method 1100 for memory expansion, in accordance with an example embodiment. At block 1102, the method 1100 includes receiving a memory request from a memory controller over a first channel. In an example embodiment, the map and control unit 1011 is configured to receive the memory request from a memory controller (not shown) over the DDR3 channel 1001.

At block 1104, the method 1100 includes reacting to the memory request by selecting a location in memory that is to be connected to a sub-channel. The memory controller may direct the memory request to a logical rank and based on the memory request, the map and control unit 1011 may select a location within memory (e.g., map the memory request to one of the sub-ranks 1017 located on one of the physical RDIMMs 1016) to connect with one of the sub-channels 1003, 1005, 1007, 1009.

Block 1106 of the method 1100 may include configuring a set of FETs to connect the first channel with the sub-channel while block 1108 may include allowing data to flow between the memory controller and the location in the memory (e.g., one of the sub-ranks 1017) over the first channel and the selected sub-channel 1003, 1005, 1007, 1009. In an example embodiment, the memory request may include a column address and a read or a write command. Once the sub-rank to read or write has been determined by the map 1011 (e.g., mapped from the logical rank targeted by the memory request), the data path unit 1013 may cause the FETs to connect the DDR3 channel 1001 with the designated sub-channel 1003, 1005, 1007, 1009 so that the read or write data can flow to an intersection of the column address and an activated row in the designated sub-rank 1017.

The data path unit 1013 may update the data path circuitry 1006, 1008 to connect with different sub-channels 1003, 1005, 1007, 1009 depending on the memory request (and e.g., logical rank indicated by the memory request) to allow data to flow between the memory controller and other of the sub-ranks 1003, 1005, 1007, 1009.

During initialization of the memory system, the memory controller (not shown) may perform read training and/or write leveling for each logical rank to align data signals with clock signals. Sub-ranks 1017 mapped to the logical rank and co-located on one of the RDIMMs may experience very similar voltages, temperatures, and timing conditions. In example embodiments where one of the physical RDIMMs 1016 maps to the logical rank, four of the sub-ranks 1017 residing on a physical RDIMM 1016 may adopt the same read training and write leveling values that were assigned to the logical rank. Thus, in various example embodiments, data may flow through the data connection circuitry 1006 and 1008 without being retimed to align with a clock signal on the mapping module 1002.

Figure 12:
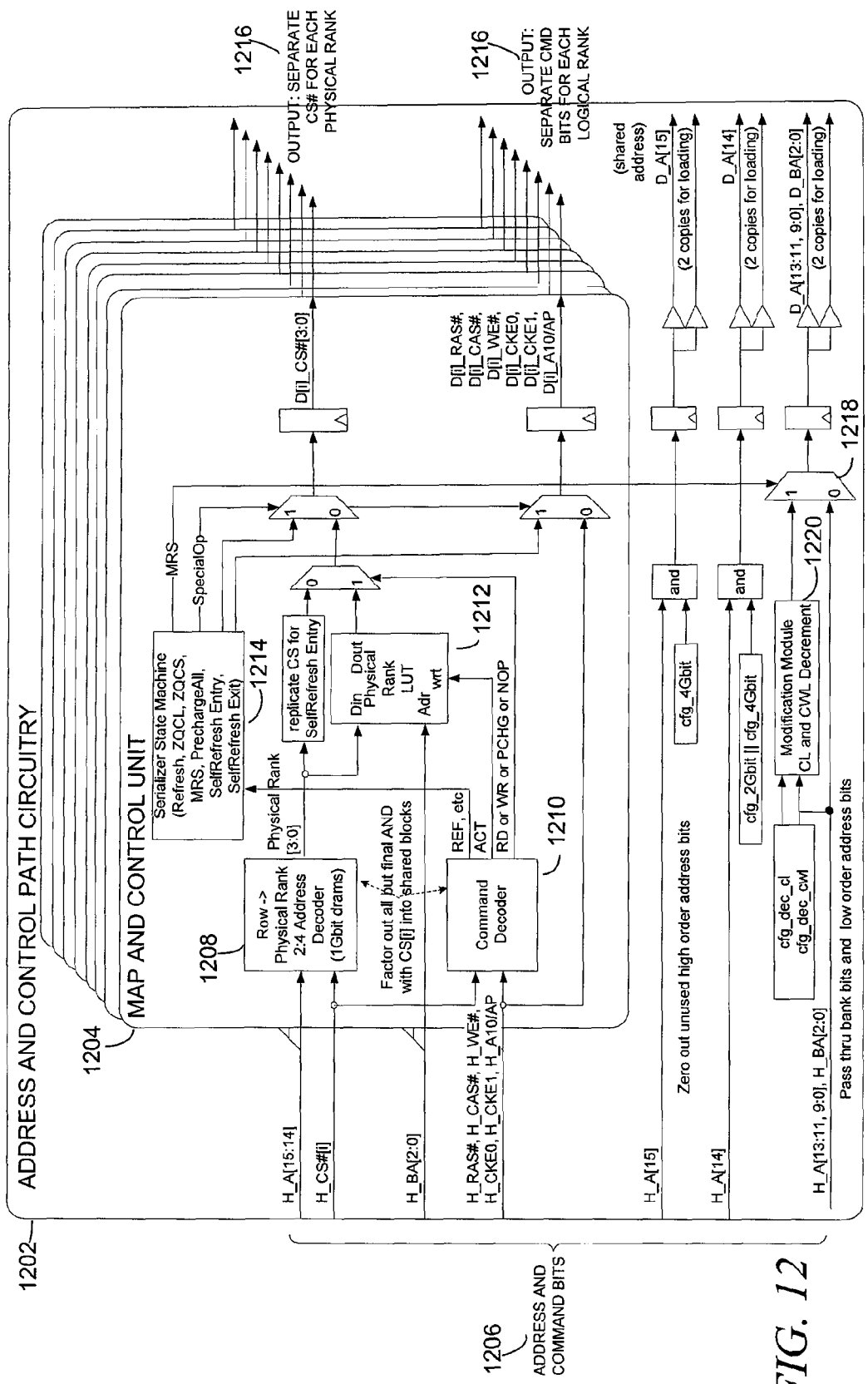
FIG. 12 is a block diagram showing example address and control path circuitry, in accordance with an example embodiment.

FIG. 12 shows a block diagram of example address and control path circuitry 1202 that includes a map and control unit 1204, in accordance with an example embodiment. The output 1216 of the map and control unit 1204 includes chip select numbers (e.g., the physical rank ID) and separate command bits for each logical rank.

In an example embodiment, the number of instances of the map and control unit 1204 is equal to the number of logical ranks as seen by the memory controller (not shown). The example map and control unit 1204 may include an address decoder 1208, a command decoder 1210, a serializer state machine 1214, a sub-rank LUT 1212 and various other supporting logic components.

In FIG. 12, address and command bits 1206 are received by the map and control unit 1204 from a memory controller. The chip select number (e.g., the logical rank ID) and the last two bits of the row address (e.g., notated as A[15:14] for logical RDIMMs based on 4 Gbit DRAMs) are received by the address decoder 1208 that may decode the two bits to map the chip select number 1206 to one of the four physical ranks (e.g., with a 2:4 decoder with enable). The address decoder 1208 may reference a map such as the map in FIG. 6 to provide the corresponding physical sub-ranks and sub-channels.

The command decoder 1210 may decode various commands and forward them to other logic components depending on the command. When a read or write command is received by the command decoder 1210, the LUT 1212 may be used to determine the physical rank in which a row of memory should be read or written. The example LUT 1212 for a particular logical rank may accomplish this by associating a bank address with a particular physical rank when a most recently received activate command activates a row in that physical rank. When a read, write or pre-charge command is received, the LUT 1212 may use the bank address specified in the read, write or pre-charge command as an index into the LUT 1212 to obtain the target physical rank. The association between bank addresses and the physical ranks may allow the LUT 1212 to locate rows of memory activated for subsequent read, write, pre-charge or any other commands, etc.

The serializer state machine 1214 may receive memory commands associated with a logical rank from the command decoder 1210, and if necessary, provide multiple copies of the memory command for physical ranks mapped to the logical rank (discussed in further detail below).

Various memory commands may be received by the serializer state machine 1214 in example embodiments. A refresh command is a DRAM command that reads and then restores the contents of one or more rows of memory to prevent data loss due to charge leakage or other effects. The ZQCL and ZQCS calibration commands may trigger calibration cycles in all physical ranks mapped to a logical rank. A ZQCL command is a DRAM command issued once per rank at boot time that triggers the initial calibration of driver output impedances and on-die termination impedances. The ZQCS command is a DRAM command issued periodically to track slow variations in voltage and temperature and triggers an update to driver output impedance and on-die termination impedance.

Other commands, such as pre-charge all and mode register write commands, may similarly be serialized by the serializer state machine 1214. The pre-charge command is a DRAM command that writes the contents of all open row/banks back to the array and then closes all row/banks. The mode register command is a DRAM command that may write DRAM latency values or other configuration information to a mode register located on a memory device. The example DDR3 DRAMs may contain mode registers MR0, MR1, MR2 and MR3. MRS commands are typically issued only by the BIOS during system initialization.

Figure 13:
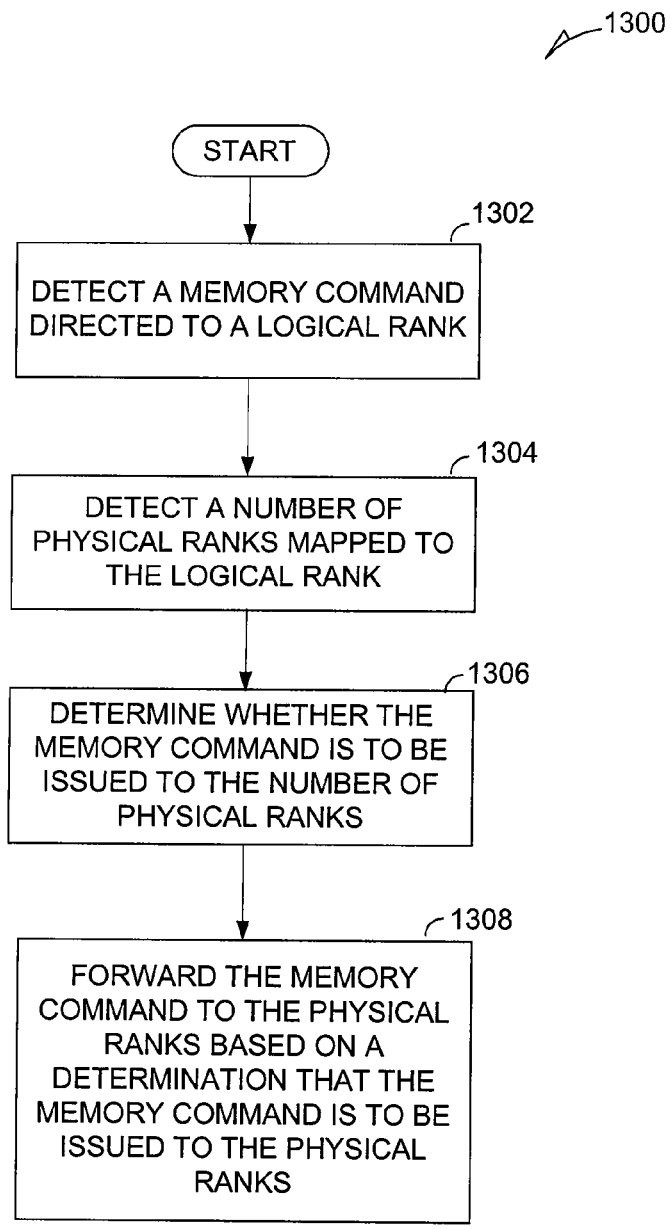
FIG. 13 is a flow diagram of a method for distributing a memory command, in accordance with an example embodiment.

FIG. 13 is a flow diagram illustrating a method 1300 for distributing a memory command, in accordance with an example embodiment. Block 1302 of method 1300 may include detecting a memory command directed to a logical rank. As shown in FIG. 12, the command decoder 1210 receives command bits 1206 and may detect memory commands directed to a logical rank.

Block 1304 may include detecting a number of physical ranks mapped to the logical rank. The address decoder 1208 shown in FIG. 12 may map physical ranks to the logical rank. In an example embodiment, the address decoder 1208 is to map the number of physical ranks to the logical rank based on a number of sets of DRAMs known to provide a full data-bit width of an RDIMM to be driven on a data bus.

Block 1306 of method 1300 may include determining whether the memory command is to be issued to the number of physical ranks. The serializer state machine 1214 may determine that a particular memory command is to be issued to mapped physical ranks if the serializer state machine 1214 detects the command as a refresh command, a ZQCL or ZQCS calibration command, a pre-charge-all command, a mode register write command, or any other command that should be distributed to a mapped physical rank, etc.

In example embodiments, an activate command to open a logical page (or e.g., row) of a certain size (e.g., 2K Bytes) is received by the map and control unit 1204. The memory controller that sends the command will expect the logical page to be available for subsequent reads and writes. If the example address decoder 1208 determines that the logical page is larger in size than the size of the physical page (e.g., 1K Bytes) to which the logical page is mapped (e.g. two times as large) then multiple physical ranks are to be issued the activate command to support the subsequent reads and writes to the logical page.

Block 1308 may include issuing the memory command to the physical ranks (e.g., the physical ranks mapped to the logical rank) based on a determination that it is appropriate to issue the memory command to the number of physical ranks. In FIG. 12, the serializer state machine 1214 is to receive the decoded command from command decoder 1210 and if the serializer state machine 1214 has determined it to be appropriate (e.g., as described with respect to block 306), issue the memory command to the number of physical ranks mapped to the logical rank by the address decoder 1208.

In an example embodiment, the number of copies of the memory command issued by the serializer state machine 1214 depends on the mapping configuration being used. If each logical rank maps to four physical ranks on a physical RDIMM, then four copies are to be sent for certain memory commands. If each logical rank maps to two physical ranks on a physical RDIMM, then two copies are to be sent for certain memory commands.

In some example embodiments, the serializer state machine 1214 is to issue the selected memory command over multiple command cycles. The number of clock cycles may depend on the configuration of the RDIMMs being used as memory. For example, RDIMMs configured for four ranks may accept up to two commands per cycle while those configured for one and two ranks may accept at most one command per cycle.

In an example embodiment, a refresh command to refresh cells within a logical rank may trigger the refresh of memory cells within physical ranks mapped to the logical rank. The four physical ranks mapped to the logical rank may share a common command bus (and e.g., a common sub-channel) and the serializer state machine 1214 may be triggered to issue a refresh command to the four physical ranks on two consecutive clock cycles. In an example embodiment, refresh commands mapped to sub-channel "0" and physical ranks "0" and "2" are (see e.g., FIG. 6) sent in the first cycle, and the refresh commands for physical ranks "1" and "3" are sent in the second cycle.

In the example case of an activate command directed to a logical page, 8 Gbit (2 Gb×4) DRAMs are emulated with 4 ranks of 2 Gbit (512 Mb×4) DRAMs and the sizes may be characterized as follows:

| DRAM DENSITY | PAGE SIZE | ROW BITS | COLUMN BITS |
| --- | --- | --- | --- |
| 8 Gbit (2 Gb × 4) | 2K Bytes | A[15:0] | A[13, 11, 9:0] |
| 2 Gbit (512 Mb × 4) | 1K Bytes | A[14:0] | A[11, 9:0] |

As described above, the address decoder may determine that an activate command is to be forwarded to two physical ranks because the logical page size is twice as large as the physical page size. In a case when the example address decoder detects that A[15]==0, the address decoder may cause the physical ranks 0 and 2 to be activated and cause the sequence 1010 to be stored in a LUT entry indexed by BA[2:0]. In a case when A[15]==1, the physical ranks 1 and 3 may be activated and 0101 stored in the LUT 1212 entry indexed by BA[2:0]. On a read or write command, the example address decoder 1208 examines A[13] along with the LUT 1212 entry to determine the physical ranks to read or write. The example correspondence would appear in a table such as the as following:

| A[13] | LUT[BA] | CS[3:0] |
| --- | --- | --- |
| 0 | 1010 | 1110 |
| 0 | 0101 | 1101 |
| 1 | 1010 | 1011 |
| 1 | 0101 | 0111 |

In an example case where an activate command for a logical page is issued to multiple physical ranks to open a logical page, a precharge command is issued to the same multiple physical ranks to close the logical page.

As explained above, the address and control path circuitry 1002 may provide the map and control unit 1204 and data path unit 1504 to map 4Gb based logical ranks to four 1 Gb-based physical ranks over a sub-channel. In an example embodiment, the processing by the address and control path circuitry 1002, 1502 may add a cycle of latency to the memory expansion system 1000.

Figure 14:
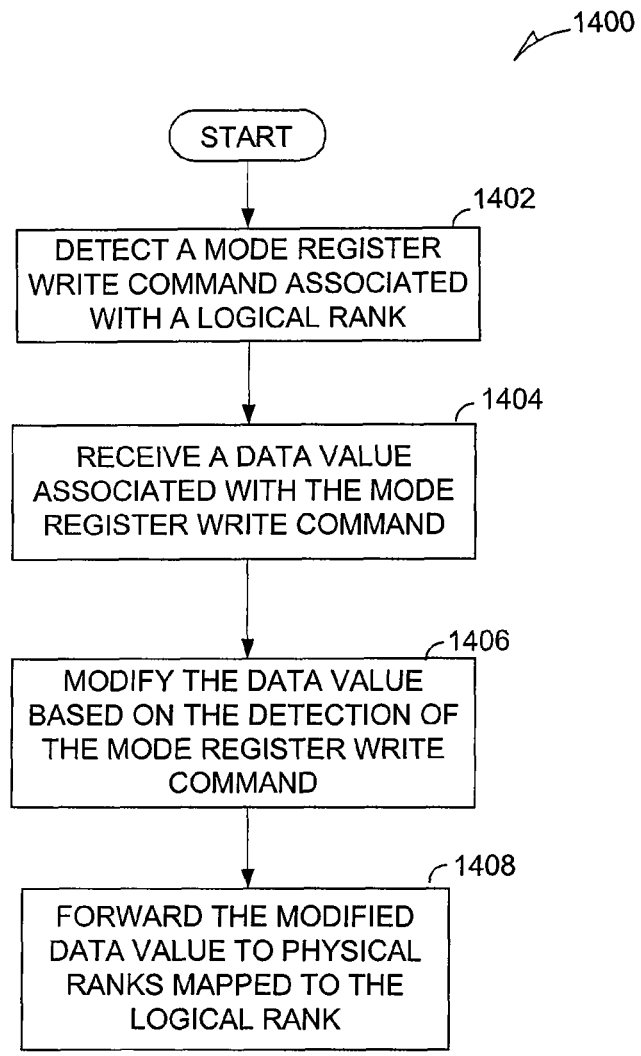
FIG. 14 is a flow diagram of illustrating a method for modifying a configuration value, in accordance with an example embodiment.

FIG. 14 is a flow diagram illustrating a method 1400 for modifying an initialization value to account for added memory system latency, in accordance with an example embodiment. At block 1402, the method 1400 may include detecting a mode register write command (e.g., with the command decoder 1210) associated with a logical rank while block 1404 may include receiving a data value (e.g., at a modification module 1220) associated with the mode register write command.

Block 1406 may include modifying the data value based on the detecting of the mode register command and at block 1408, the method 1400 may conclude with forwarding the modified data value to a number of physical ranks (e.g., physical ranks mapped to the logical rank).

In an example embodiment, the modification module 1220 receives a data value associated with the mode register write command. Upon receiving the mode register write command for a logical rank, the serializer state machine 1214 may be further configured to signal a multiplexer 1218 that receives input from the modification module 1220. The modification module 1220 may modify the data value before a modified data value is forwarded to physical ranks mapped from the logical rank. In an example embodiment, the modification module 1220 is to decrement mode register data values to account for the cycle of latency added by the address and control path circuitry 1202, 1502.

Figure 15:
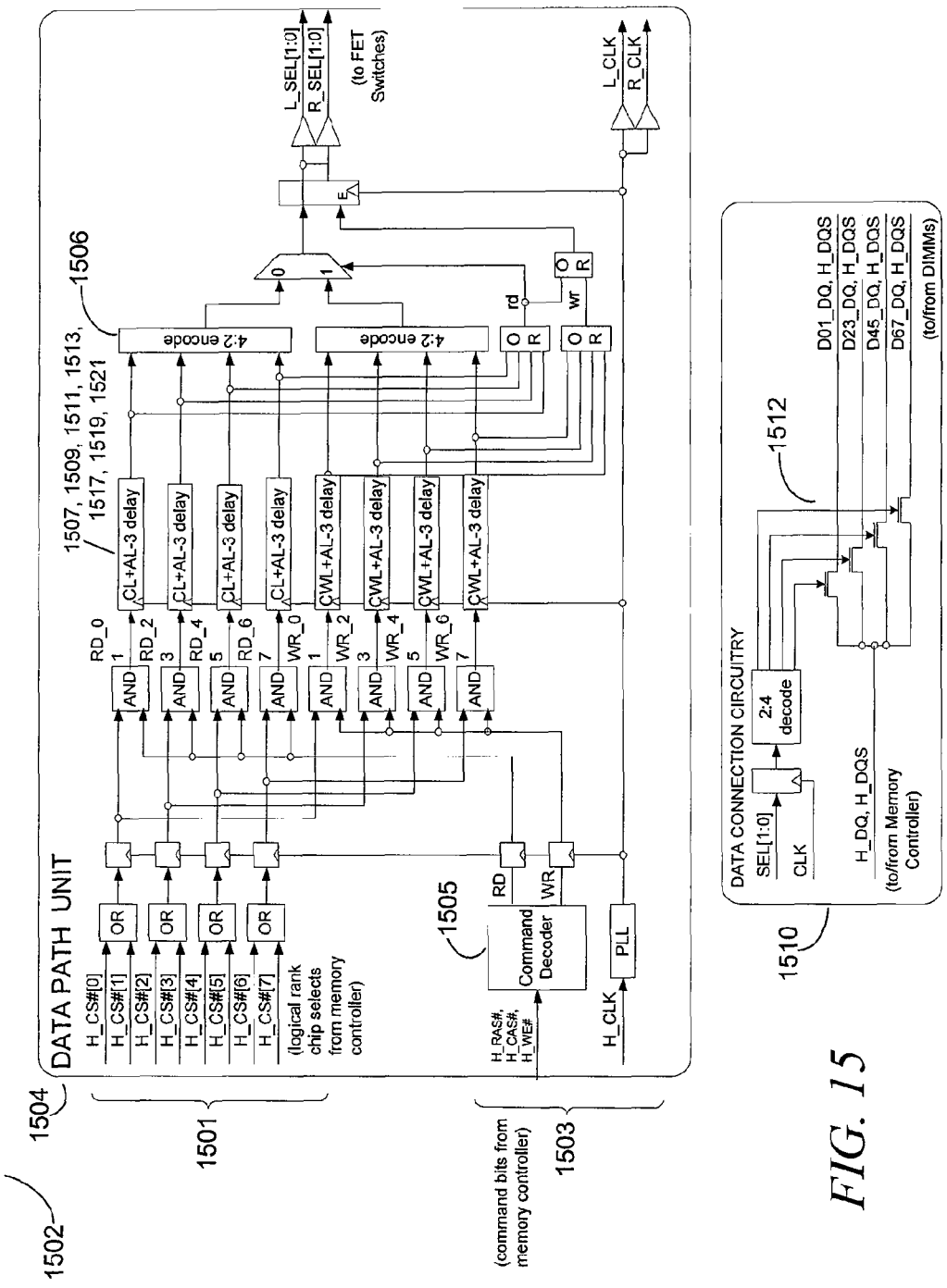
FIG. 15 is a block diagram illustrating example address and control path circuitry and data connection circuitry, in accordance with an example embodiment.

FIG. 15 is a block diagram illustrating example address and control path circuitry 1502 that includes a data path unit 1504, in accordance with an example embodiment. Also shown is data connection circuitry 1510 configured to use FETs 1512 to distribute data on the data paths 1012 and 1014. The example data path unit 1504 may include a command decoder 1505 that may receive the same memory commands, 1503 as received 1206 by the map and control unit 1204 of FIG. 12.

Figure 16:
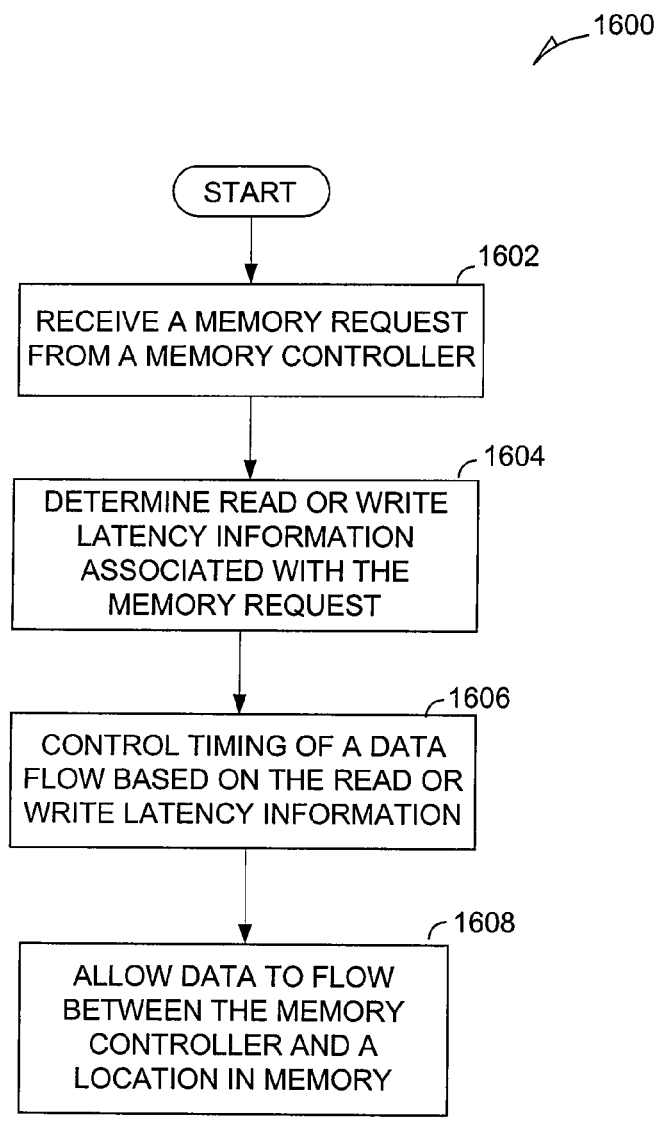
FIG. 16 is a flow diagram illustrating a method for controlling a data flow, in accordance with an example embodiment.

FIG. 16 is a flow diagram illustrating a method 1600 for controlling a data flow, in accordance with an example embodiment. At block 1602, the method begins with receiving a memory request from a memory controller. In FIG. 15, the command decoder 1505 may decode a memory command and forward it to be associated with a logical rank chip select shown to be received by the data path unit 1504.

At block 1604, read or write latency associated with the memory request is to be determined so that at block 1606 the determined read or write latency may be used to control data flow timing (e.g., data flowing between the memory controller and physical memory). Referring again to FIG. 15, the data path unit 1504 may receive chip select information at the chip select input 1501. The data path unit 1504 may then pair a decoded memory request with corresponding chip select information. The appropriate timing controller 1507, 1509, 1511, 1513, 1515, 1517, 1519 or 1521 may then provide stored latency information (e.g., column access strobe (CAS) latency and additive latency (AL)) associated with the decoded command and apply the appropriate time controls.

At block 1608, the method may include allowing the data to flow between the memory controller and the location in memory (e.g., over the first channel and the sub-channel). In an example embodiment, the FET control signals may be encoded (e.g., by the encoders 1506) and forwarded to the data connection circuitry 1510 where the FET switches 1512 may be updated to allow data to pass between the memory controller and the physical RDIMMs. As described above, the FET switches 1512 may be used to steer the data to the appropriate sub-channel.

In some embodiments, a pipelined data path may be employed instead of a FET based data path. The pipelined data path may provide re-timing of both read and data transfers, and may include data bus termination, read leveling, write leveling, read strobe centering, and write strobe centering.

With further regard to latency, timing of read bursts and write bursts relative to read and write commands is determined by the CAS latency and additive latency. The address and control path circuitry 1202, 1502 may provide a data path between the memory controller and physical memory in a timely fashion such that the memory devices may be accessed while the memory expansion configuration can remain transparent to the memory controller. Example timing may include the following:

A read burst begins at a time after a read latency (RL) determined by:

$$RL = AL + CL \text{ cycles after a read command}$$

The read preamble may occupy one cycle prior to the read burst. In an example embodiment, the data path may permit the proper FET switch paths to connect the host channel to the communication sub-channel being accessed at a number of cycles after the read command determined by:

$$RL - 1 = AL + CL - 1$$

The connection between the host channel and communication sub-channel may be maintained until the next read or write command causes a new connection to be made.

A write burst begins at a time after a write latency (WL) determined by:

$$WL = AL + CWL$$

The write preamble occupies one cycle prior to the write burst. In an example embodiment, the data path may permit the proper FET switch paths to connect the host channel to the sub-channel at a number of cycles after the write command determined by:

$$WL - 1 = AL + CWL - 1$$

The connection between the host channel and the communication sub-channel may be maintained until the next read or write command causes a new connection to be made.

The above description is intended to be illustrative and not restrictive. For example, one or more aspects of the above-described embodiments may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels and are not intended to impose numerical requirements on their objects.

The Abstract is provided to comply with 37 C.F.R. §1.72 (b), which requires that it allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is
1. A method comprising:
retrieving first initialization data from a physical dual inline memory module (DIMM);

converting the first initialization data to second initialization data of a logical DIMM mapped to the physical DIMM, the converting of the first initialization data to the second initialization data being based on a linear function that multiplies a first initialization value included in the first initialization data by a factor to determine a second initialization value included in the second initialization data, the first initialization value corresponding to a first memory capacity of the physical DIMM and the second initialization value corresponding to a second memory capacity of the logical DIMM; and programming a memory controller based on the second initialization data corresponding to the logical DIMM to control memory access to the physical DIMM.

2. The method of claim 1, wherein
the retrieving of the first initialization data includes receiving the first memory capacity of the physical DIMM, a first number of ranks within the physical DIMM, first timing information associated with the physical DIMM and first latency information associated with the physical DIMM, and the converting of the first initialization data to the second initialization data includes converting the first memory capacity to the second memory capacity of the logical DIMM, converting the first number of ranks to a second number of ranks within the logical DIMM, converting the first timing information to second timing information associated with the logical DIMM and converting first latency information to second latency information associated with the logical DIMM.

3. The method of claim 1, wherein the memory controller accesses a look-up table that relates portions of the logical DIMM to portions of the physical DIMM.

4. A system comprising:
retrieving means for retrieving first initialization data from a physical dual inline memory module (DIMM);
converting means for converting the first initialization data to second initialization data of a logical DIMM mapped to the physical DIMM, the converting means including a computer-implemented linear function that multiplies a first initialization value included in the first initialization data by a factor to determine a second initialization value included in the second initialization data, the first initialization value corresponding to a first memory capacity of the physical DIMM and the second initialization value corresponding to a second memory capacity of the logical DIMM; and
programming means for programming a memory controller based on the second initialization data corresponding to the logical DIMM to control memory access to the physical DIMM.

5. The system of claim 4, wherein the memory controller accesses a look-up table that relates portions of the logical DIMM to portions of the physical DIMM.

6. A system comprising:
a basic input output system (BIOS) module communicatively coupled with a physical dual inline memory module (DIMM) and a memory controller, the BIOS module configured to:
retrieve first initialization data from the physical DIMM;
convert the first initialization data to second initialization data of a logical DIMM mapped to the physical DIMM, the converting of the first initialization data to the second initialization data being based on a linear function that multiplies a first initialization value included in the first initialization data by a factor to determine a second initialization value included in the second initialization data, the first initialization value corresponding to a first memory capacity of the physical DIMM and the second initialization value corresponding to a second memory capacity of the logical DIMM; and program the memory controller based on the second initialization data corresponding to the logical DIMM to control memory access to the physical DIMM.

7. The system of claim 6, wherein the first initialization data retrieved by the BIOS module includes the first memory capacity of the physical DIMM, a number of ranks within the physical DIMM, timing information associated with the physical DIMM and latency information associated with the physical DIMM; and the second initialization data includes the second memory capacity of the logical DIMM, a number of ranks within the logical DIMM, timing information associated with the logical DIMM and latency information associated with the logical DIMM.

8. The system of claim 6, wherein the memory controller accesses a look-up table that relates portions of the logical DIMM to portions of the physical DIMM.

9. A non-transitory machine-readable medium having instructions that, when executed by a processing system, cause the processing system to:
retrieve first initialization data from a physical dual inline memory module (DIMM);
convert the first initialization data to second initialization data of a logical DIMM mapped to the physical DIMM, the converting of the first initialization data to the second initialization data being based on a linear function that multiplies a first initialization value included in the first initialization data by a factor to determine a second initialization value included in the second initialization data, the first initialization value corresponding to a first memory capacity of the physical DIMM and the second initialization value corresponding to a second memory capacity of the logical DIMM; and
program a memory controller based on the second initialization data corresponding to the logical D1MM to control memory access to the physical DIMM.

10. The non-transitory machine-readable medium of claim 9, wherein the memory controller accesses a look-up table that relates portions of the logical DIMM to portions of the physical DIMM.

11. The method of claim 1, wherein
the logical DIMM includes a plurality of logical ranks of logical memory elements;
the physical DIMM includes a plurality of physical ranks of physical memory elements, each physical rank having a width equivalent to a corresponding data channel thr transmitting physical-memory-element values; and
a first logical rank of the logical DIMM is mapped to the physical DIMM.

12. The method of claim 1, wherein
the logical DIMM includes a plurality of logical ranks of logical memory elements;
the physical DIMM includes a plurality of physical ranks of physical memory elements; and
a first logical rank of the logical DIMM and a portion of a logical row address of the first logical rank are mapped by the memory controller to a first physical rank of the physical DIMM and to a corresponding channel for transmitting physical-memory-element values, the corresponding channel being selected from a plurality of channels for transmitting physical-memory-element values and the first physical rank being selected from a plurality of physical ranks connected to the corresponding channel, the corresponding channel providing a unique path among the sub-channels for transmitting physical-memory-element values that are stored at the physical memory elements of the first physical rank.

13. The method of claim 12, wherein the first physical rank has a width that is equivalent to the corresponding channel for the transmitting physical-memory-element values.

14. The system of claim 4, wherein
the logical DIMM includes a plurality of logical ranks of logical memory elements;
the physical DIMM includes a plurality of physical ranks of physical memory elements, each physical rank having a width equivalent to a corresponding data channel for transmitting physical-memory-element values; and
a first logical rank of the logical DIMM is mapped to the physical DIMM.

15. The system of claim 4, wherein
the logical DIMM includes a plurality of logical ranks of logical memory elements;
the physical DIMM includes a plurality of physical ranks of physical memory elements; and
a first logical rank of the logical DIMM and a portion of a logical row address of the first logical rank are mapped by the memory controller to a first physical rank of the physical DIMM and to a corresponding channel for transmitting physical-memory-element values, the corresponding channel being selected from a plurality of channels for transmitting physical-memory-element values and the first physical rank being selected from a plurality of physical ranks connected to the corresponding channel, the corresponding channel providing a unique path among the sub-channels for transmitting physical-memory-element values corresponding to the first physical rank.

16. The system of claim 15, wherein the first physical rank has a width that is equivalent to the corresponding channel for transmitting the physical-memory-element values.

17. The system of claim 6, wherein
the logical DIMM includes a plurality of logical ranks of logical memory elements;
the physical DIMM includes a plurality of physical ranks of physical memory elements, each physical rank having a width equivalent to a corresponding data channel for transmitting physical-memory-element values; and
a first logical rank of the logical DIMM is mapped to the physical DIMM.

18. The system of claim 6, wherein
the logical DIMM includes a plurality of logical ranks of logical memory elements;
the physical DIMM includes a plurality of physical ranks of physical memory elements; and
a first logical rank of the logical DIMM and a portion of a logical row address of the first logical rank are mapped by the memory controller to a first physical rank of the physical DIMM and to a corresponding channel for transmitting physical-memory-element values, the corresponding channel being selected from a plurality of channels for transmitting physical-memory-element values and the first physical rank being selected from a plurality of physical ranks connected to the corresponding channel, the corresponding channel providing a unique path among the sub-channels for transmitting physical-memory-element values corresponding to the first physical rank.

19. The system of claim 18, wherein the first physical rank has a width that is equivalent to the corresponding channel for transmitting the physical-memory-element values.

20. The machine-readable medium of claim 9, wherein
the logical DIMM includes a plurality of logical ranks of logical memory elements;
the physical DIMM includes a plurality of physical ranks of physical memory elements, each physical rank having a width equivalent to a corresponding data channel for transmitting physical-memory-element values; and
a first logical rank of the logical DIMM is mapped to the physical DIMM.

21. The machine-readable medium of claim 9, wherein
the logical DIMM includes a plurality of logical ranks of logical memory elements;
the physical DIMM includes a plurality of physical ranks of physical memory elements; and
a first logical rank of the logical DIMM and a portion of a logical row address of the first logical rank are mapped by the memory controller to a first physical rank of the physical DIMM and to a corresponding channel for transmitting physical-memory-element values, the corresponding channel being selected from a plurality of channels for transmitting physical-memory-element values and the first physical rank being selected from a plurality of physical ranks connected to the corresponding channel, the corresponding channel providing a unique path among the sub-channels for transmitting physical-memory-element values corresponding to the first physical rank.

22. The machine-readable medium of claim 21, wherein the first physical rank has a width that is equivalent to the corresponding channel for transmitting the physical-memory-element values.

23. The method of claim 1, wherein the memory controller is programmed to access the physical DIMM through addresses of the logical DIMM, the memory controller being connected to the physical DIMM.

* * * * *

UNITED STATES PATENT AND TRADEMARK OFFICE
CERTIFICATE OF CORRECTION

PATENT NO.        : 8,621,132 B2
APPLICATION NO.   : 11/971080
DATED             : December 31, 2013
INVENTOR(S)       : Mario Mazzola et al.

Page 1 of 1

It is certified that error appears in the above-identified patent and that said Letters Patent is hereby corrected as shown below:

In the Claims:

In column 20, line 39, in claim 9, delete "D1MM" and insert --DIMM--, therefor

In column 20, line 50, in claim 11, delete "thr" and insert --for--, therefor

In column 22, line 1, in claim 18, delete "D1MM" and insert --DIMM--, therefor

Signed and Sealed this
Twenty-seventh Day of May, 2014

Michelle K. Lee
*Deputy Director of the United States Patent and Trademark Office*